United States Patent
Hahn et al.

(10) Patent No.: US 9,112,127 B2
(45) Date of Patent: Aug. 18, 2015

(54) METHOD FOR PRODUCING AT LEAST ONE OPTOELECTRONIC SEMICONDUCTOR COMPONENT

(75) Inventors: Berthold Hahn, Hemau (DE); Andreas Leber, Regensburg (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 44 days.

(21) Appl. No.: 14/003,207

(22) PCT Filed: Mar. 2, 2012

(86) PCT No.: PCT/EP2012/053650
§ 371 (c)(1),
(2), (4) Date: Oct. 13, 2013

(87) PCT Pub. No.: WO2012/119950
PCT Pub. Date: Sep. 13, 2012

(65) Prior Publication Data
US 2014/0042466 A1     Feb. 13, 2014

(30) Foreign Application Priority Data
Mar. 4, 2011   (DE) .......................... 10 2011 013 052

(51) Int. Cl.
| | |
|---|---|
| *H01L 33/64* | (2010.01) |
| *H01L 33/00* | (2010.01) |
| *H01L 33/42* | (2010.01) |
| *H01L 33/62* | (2010.01) |

(52) U.S. Cl.
CPC .............. *H01L 33/64* (2013.01); *H01L 33/005* (2013.01); *H01L 33/42* (2013.01); *H01L 33/62* (2013.01); *H01L 2924/0002* (2013.01); *H01L 2933/005* (2013.01); *H01L 2933/0066* (2013.01)

(58) Field of Classification Search
CPC ... H01L 33/005; H01L 33/64; H01L 33/0079; H01L 27/15; H01L 27/153; H01L 27/156
USPC ........................................................... 257/88
See application file for complete search history.

(56) References Cited

U.S. PATENT DOCUMENTS

| | | | | |
|---|---|---|---|---|
| 6,045,240 | A | * | 4/2000 | Hochstein ..................... 362/294 |
| 2009/0173954 | A1 | * | 7/2009 | Beeson et al. ................. 257/88 |

(Continued)

FOREIGN PATENT DOCUMENTS

| | | |
|---|---|---|
| DE | 102008021402 A1 | 11/2009 |
| DE | 102008030346 A1 | 12/2009 |

(Continued)

*Primary Examiner* — Michael Lebentritt
*Assistant Examiner* — Jordan Klein
(74) *Attorney, Agent, or Firm* — Slater & Matsil, L.L.P.

(57) ABSTRACT

A method can be used to provide at least one optoelectronic semiconductor component, A carrier includes a first surface and a second surface opposite the first surface. At least one optoelectronic semiconductor chip is arranged on the first surface of the carrier. The optoelectronic semiconductor chip is formed with at least one n-side region and at least one p-side region, and is applied with the n-side region or the p-side region to the first surface. An electrically insulating enclosure is arranged on exposed points of the outer faces of the semiconductor chip and of the first surface of the carrier. The electrically insulating enclosure is partially removed. After removal at least one major face, remote from the carrier, of the optoelectronic semiconductor chip is free of the electrically insulating enclosure at least in places.

11 Claims, 2 Drawing Sheets

(56) References Cited

U.S. PATENT DOCUMENTS

| | | |
|---|---|---|
| 2010/0009477 A1* | 1/2010 | Lee .................................. 438/29 |
| 2010/0072489 A1 | 3/2010 | McLaurin et al. |
| 2010/0244056 A1* | 9/2010 | Ray et al. ......................... 257/88 |
| 2010/0276706 A1* | 11/2010 | Herrmann ........................ 257/89 |
| 2011/0090699 A1* | 4/2011 | Shida et al. .................... 362/294 |
| 2012/0119233 A1* | 5/2012 | Weidner et al. ................. 257/88 |

FOREIGN PATENT DOCUMENTS

| | | |
|---|---|---|
| DE | 102009015313 A1 | 9/2010 |
| DE | 102009036621 A1 | 2/2011 |
| WO | 2008150960 A1 | 12/2008 |

* cited by examiner

METHOD FOR PRODUCING AT LEAST ONE OPTOELECTRONIC SEMICONDUCTOR COMPONENT

This patent application is a national phase filing under section 371 of PCT/EP2012/053650, filed Mar. 2, 2012, which claims the priority of German patent application 10 2011 013 052.7, filed Mar. 4, 2011, each of which is incorporated herein by reference in its entirety.

TECHNICAL FIELD

A method for producing at least one optoelectronic semiconductor component and an optoelectronic semiconductor component are specified.

SUMMARY OF THE INVENTION

Embodiments of the present invention provide a method for producing an optoelectronic semiconductor element that is inexpensive.

According to at least one embodiment of the method, in a first step a carrier is provided, which comprises a first surface and a second surface opposite the first surface. The first surface and the second surface are parts of the outer face of the carrier. The carrier may, for example, be a mounting board, which is formed with an electrically insulating material, such as, for example, a plastics or ceramic material. It is conceivable for the carrier to be flexible, for example, in the form of a foil.

According to at least one embodiment of the method, in a next step at least one optoelectronic semiconductor chip is arranged on the first surface of the carrier, the optoelectronic semiconductor chip being formed with at least one n-side region and at least one p-side region. In this case, the optoelectronic semiconductor chip is applied to the first surface with its n-side region or its p-side region. The optoelectronic semiconductor chip is for example formed with a semiconductor body which is grown epitaxially. The n- and p-side regions may be formed in places by semiconductor layer sequences of the semiconductor body. "P- and n-side" mean in this context that the semiconductor body comprises regions which are "n- or p-conductive" with regard to their electrical conductivity.

The optoelectronic semiconductor chip may comprise a luminescent diode chip. The luminescent diode chip may be a light-emitting or laser diode chip, which emits radiation in the range of ultraviolet to infrared light. According to at least one embodiment of the method, in a next step an electrically insulating enclosure is arranged on exposed points of the outer faces of the semiconductor chip and the first surface of the carrier. The optoelectronic semiconductor chip comprises at its outer faces for example, at least one side face and at least one major face remote from the carrier. The major face may be formed by the n-side or the p-side region. The side faces extend transversely of the main direction of extension of the carrier and/or of the semiconductor chip. After arrangement of the electrically insulating enclosure, the electrically insulating enclosure completely covers all exposed points of the outer faces of the semiconductor chip and of the first surface of the carrier. Preferably, neither a gap nor a discontinuity forms between the electrically insulating enclosure on the one hand and the points covered by the electrically insulating enclosure. In other words, the at least one optoelectronic semiconductor chip may be completely enclosed by the electrically insulating enclosure after arrangement thereof.

According to at least one embodiment of the method, in a next step the electrically insulating enclosure is partially removed, wherein after removal at least one major face, remote from the carrier, of the optoelectronic semiconductor chip is free of the electrically insulating enclosure at least in places. "Free" means that the major face, remote from the carrier, of the at least one optoelectronic semiconductor chip is not covered by the electrically insulating enclosure at least in places. It is at most possible that at most 10%, preferably at most 5%, of the regions of the major face freed of the electrically insulating enclosure are covered by the electrically insulating enclosure.

According to at least one embodiment of the method, in a first step a carrier is provided, which comprises a first surface and a second surface opposite the first surface. In a next step at least one optoelectronic semiconductor chip is arranged on the first surface of the carrier, the optoelectronic semiconductor chip being formed with at least one n-side region and at least one p-side region. The optoelectronic semiconductor chip is applied to the first surface with the n-side region or the p-side region. In a next step, an electrically insulating enclosure is arranged on exposed points of the outer faces of the semiconductor chip and of the first surface of the carrier. Furthermore, in a next step the electrically insulating enclosure is partially removed, wherein after removal at least one major face, remote from the carrier, of the optoelectronic semiconductor chip is free of the electrically insulating enclosure at least in places.

The method described here for producing an optoelectronic semiconductor component is based inter alia on the recognition that the production of an optoelectronic semiconductor component may often be associated with high costs. In particular, for example, individual contacting of an optoelectronic semiconductor chip of the optoelectronic semiconductor component may be complex and time-consuming aspects of manufacture.

The method described here allows simultaneous electrical contacting, for example, of a plurality of optoelectronic semiconductor chips in one method step. In other words, subsequent removal of the electrically insulating enclosure and thus at least partial exposure of the major faces of the optoelectronic semiconductor chip allows maximally simple, time-saving production of the optoelectronic semiconductor component.

According to at least one embodiment, after removal of the electrically insulating enclosure the major face, remote from the carrier, of the optoelectronic semiconductor chip is complete freely of the electrically insulating enclosure. After removal, the electrically insulating enclosure, for example, terminates flush in the vertical direction with the major face, remote from the carrier, of the optoelectronic semiconductor chip. In this context, "vertical direction" means a direction perpendicular to the main direction of extension of the carrier. In this case, the electrically insulating enclosure may for example completely cover the side faces of the optoelectronic semiconductor chip. A surface, remote from the carrier, of the electrically insulating enclosure, for example, forms a contiguous, continuous face together with the major face, remote from the carrier, of the optoelectronic semiconductor chip. That is to say that neither a gap nor a discontinuity forms in the lateral direction, i.e., parallel to the main direction of extension of the carrier, between the electrically insulating enclosure and the major face of the optoelectronic semiconductor chip.

According to at least one embodiment, the electrically insulating enclosure is removed by uniform thinning of the electrically insulating enclosure. Thinning is performed, for example, using a chemical and/or mechanical grinding and/or etching method. "Thinning" means that, during removal of the electrically insulating enclosure, the maximum vertical extent of the latter is reduced. "Uniform" means in this context that, after thinning, the electrically insulating enclosure has a constant vertical extent, i.e., thickness, over its entire lateral extent, within the context of manufacturing tolerance.

According to at least one embodiment, in a next step at least one conductive track structure is arranged at least on the major face, the conductive track structure being in direct contact with the semiconductor chip and contacted electrically conductively on the p-side or the n-side. If the semiconductor chip is applied with its n-side region on the first surface of the carrier, it is feasible for the conductive track structure to contact the semiconductor chip electrically conductively on the p-side. In this case the conductive track structure is a p-side conductive track structure. The same applies if the semiconductor chip is applied with its p-side region on the first surface of the carrier. The conductive track structure is at least in places in direct contact with the major face of the optoelectronic semiconductor chip. The major face may terminate flush with the electrically insulating enclosure, such that the conductive track structure is in direct contact with the surface formed by the major face and the electrically insulating enclosure. The conductive track structure is applied, for example, by vapor depositing and/or printing at least the material of the conductive track structure onto the outer face of the optoelectronic semiconductor chip. The conductive track structure is formed, for example, by individual and/or contiguously formed conductor tracks and/or contact points connected together electrically conductively. In other words, with external electrical contacting the conductive track structure forms a p-contact or an n-contact. The conductive track structure is formed, for example, with an electrically conductive material, for example, a metal and/or an electrically conductive adhesive.

According to at least one embodiment, in a next step at least one component carrier is arranged on a side of the conductive track structure remote from the semiconductor chip. On the side of the conductive track structure remote from the semiconductor chip, an outer face may be formed. The component carrier is arranged on this outer face, for example. As the method proceeds, the component carrier provides mechanical stabilization of the carrier and of the assembly applied to the carrier and consisting of the electrically insulating enclosure and the optoelectronic semiconductor chip.

According to at least one embodiment of the method, in a next step the carrier is removed, wherein, after removal of the carrier, the n-side or the p-side region is exposed at least in places. The exposed region is for example formed in places by a further major face, remote from the component carrier, of the optoelectronic semiconductor chip. The optoelectronic semiconductor chip then comprises at least one major face and at least one further major face, the two major faces being opposite one another. That is to say that, after removal of the component carrier, the further major face, remote from the component carrier, of the optoelectronic semiconductor chip may form a contiguous, continuous face together with a further surface, remote from the component carrier, of the electrically insulating enclosure. In this case too, the surface and the further surface of the electrically insulating enclosure are opposite one another.

According to at least one embodiment of the method, in a next step at least one electrically conductive, transparent oxide layer is arranged on a radiation exit face of the optoelectronic semiconductor chip, the electrically conductive, transparent oxide layer electrically conductively contacting the semiconductor chip on the n-side or the p-side. The radiation exit face is, for example, the further major face, remote from the component carrier, of the optoelectronic semiconductor chip.

If the semiconductor chip is applied with its n-side region on the first surface of the carrier, the radiation exit face is formed by the n-side region. For example, with external electrical contacting of the subsequent optoelectronic semiconductor component, the electrically conductive, transparent oxide layer forms an n-contact. The same applies if the semiconductor chip is applied with its p-side region on the first surface of the carrier. In this case the radiation exit face is formed by the p-side region. In this context, "transparent" means that the oxide layer is at least 80%, preferably over 90%, radiation-transmissive at least for electromagnetic radiation generated primarily by the optoelectronic semiconductor chip.

For example, the electrically conductive, transparent oxide layer is formed with a TCO (transparent conductive oxide) material. The TCO material is then, for example, a material such as for example zinc oxide, tin oxide, cadmium oxide, titanium oxide, indium oxide or indium-tin oxide (ITO). In addition to binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of the stated materials also belong to the TCO materials. Furthermore, the TCO materials do not necessarily correspond to a stoichiometric composition and may also be p- or n-doped.

Such contacting of the optoelectronic semiconductor chip by the method described here via the conductive track structure and/or the transparent, electrically conductive oxide layer makes it possible to dispense for example with bulky bonding wire contacting when providing electrical contacting for the semiconductor chip. Consequently, outer faces of the semiconductor chip may be particularly small in size as a result of the electrical contacting described herein. Moreover, an emission geometry is fixed for the semiconductor chip by the mounting and contacting of the semiconductor chip described here, and is not affected for example, by the thickness of the electrically insulating enclosure varying in the lateral direction. If a plurality of semiconductor chips are arranged on the carrier, these may for example be sorted into different colors before mounting on the carrier, so enabling tight control of the color location of the semiconductor chips.

According to at least one embodiment of the method, the carrier is formed with a base element and with an electrically insulating mounting element arranged on an outer face of the base element, the mounting element being formed at least in places with a plastics material and the optoelectronic semiconductor chip being arranged on an outer face of the mounting element remote from the base element. The mounting element is, for example, a plastics foil. During arrangement of the optoelectronic semiconductor chip on the outer face, remote from the base element, of the electrically insulating mounting element, the base element for example, forms a mechanical reinforcement for the mounting element formed at least in places with a plastics material, while the mounting element in particular allows the optoelectronic semiconductor chip to be arranged as simply and with as few problems as possible on the mounting element. The base element may take the form of a board or wafer. The materials of the base element and the mounting element are, for example, different, that is to say that the materials of the base element and the mounting element are at least not identical. The base element may be formed with a metal, a semiconductor material and/or a glass.

According to at least one embodiment of the method, the component carrier is formed with an electrically insulating component layer and a thermally conductive heat sink, the component carrier being arranged with an outer face, remote from the thermally conductive heat sink, of the electrically insulating component layer on the conductive track structure. The electrically insulating component layer is, for example, a layer which is formed with an oxide, for example, an aluminum oxide, or with an aluminum nitride. The thermally conductive heat sink is, for example, formed with an electrically conductive material, for example, a metal. The electrically insulating component layer electrically insulates the heat sink, which is, for example, also electrically conductive, from the conductive track structure. In this way, for example, short circuits between the component carrier and/or the heat sink and the conductive track structure are avoided. The heat sink is formed, for example, with an electrodeposition method. In this case, an adhesion-promoting layer (or seed layer) may be applied on the outer face of the component layer prior to application of the heat sink. The adhesion-promoting layer allows and/or simplifies application and formation of the heat sink during the electrodeposition method. The adhesion-promoting layer is formed, for example, with copper or gold.

According to at least one embodiment of the method, a plurality of optoelectronic semiconductor chips is arranged on the first surface of the carrier, at least two optoelectronic semiconductor chips emitting light of different colors. For example, the plurality of optoelectronic semiconductor chips comprises semiconductor chips which each emit light in different colors, for example, blue, red or green light. In other words, the method described herein may be used to produce light-emitting RGB modules and/or (illuminated) displays in a particularly cost-effective and simple manner.

According to at least one embodiment, the electrically insulating enclosure is radiation-reflecting or radiation-absorbing. "Radiation-reflecting" means in particular that the electrically insulating enclosure reflects at least 80%, preferably over 90%, of electromagnetic radiation generated primarily within the optoelectronic semiconductor chip. In this case, the electrically insulating enclosure may appear white to an external observer of the subsequent optoelectronic semiconductor component. To this end, radiation-reflecting particles are, for example, introduced into the electrically insulating enclosure, which are formed for example, with at least one of the materials $TiO_2$, $BaSO_4$, ZnO, $ZrO_2$, or $Al_xO_y$, or contain one of the stated materials.

Electromagnetic radiation leaving via the side faces of the optoelectronic semiconductor chip is, for example, reflected by the radiation-reflecting enclosure from the enclosure back into the semiconductor chip and, for example, in the direction of the radiation exit face. In other words, a radiation-reflecting electrically insulating enclosure configured in this way may increase the radiation outcoupling efficiency of the optoelectronic semiconductor component. "Radiation outcoupling efficiency" means in this context the ratio of light energy outcoupled from the semiconductor component to light energy generated primarily within the optoelectronic semiconductor chip. In the case of a radiation-absorbing electrically insulating enclosure, said enclosure appears black or colored to an external observer. For example, carbon black particles are introduced into the electrically insulating enclosure. In this case, a brightness contrast between the radiation exit face and the further surface, remote from the component carrier, of the electrically insulating enclosure may be increased. To an external observer the optoelectronic semiconductor component, for example, appears brighter in operation as a result of the increase in brightness contrast.

An optoelectronic semiconductor component is furthermore provided.

The optoelectronic semiconductor component may, for example, be produced by means of the method described here, as described in connection with one or more of the above-stated embodiments. That is to say that the features explained for the method described here are also disclosed for the optoelectronic semiconductor component described herein.

According to at least one embodiment, the optoelectronic semiconductor component comprises a component carrier, which comprises an outer face and a mounting face opposite the outer face. In addition, the optoelectronic semiconductor component comprises at least one conductive track structure, which is arranged on the outer face. In addition, the optoelectronic semiconductor component comprises at least one optoelectronic semiconductor chip, the optoelectronic semiconductor chip being formed with at least one n-side region and at least one p-side region, and being applied with the p-side region or the n-side region to the conductive track structure. In this case, the conductive track structure contacts the semiconductor chip electrically conductively on the p-side or on the n-side.

In addition, the optoelectronic semiconductor component comprises an electrically insulating enclosure, which is arranged on exposed points of outer faces of the semiconductor chip and of the conductive track structure, at least one radiation exit face, remote from the component carrier, of the optoelectronic semiconductor chip being free of the electrically insulating enclosure at least in places. The optoelectronic semiconductor component further comprises at least one electrically conductive, transparent oxide layer, which is arranged on the radiation exit face, the electrically conductive, transparent oxide layer contacting the semiconductor chip electrically conductively on the n-side or on the p-side.

BRIEF DESCRIPTION OF THE DRAWINGS

The method described here and an optoelectronic semiconductor component described here will be explained in greater detail below with reference to an exemplary embodiment and the associated figures.

FIG. 1G shows an exemplary embodiment of an optoelectronic semiconductor component produced using the method described herein.

In the exemplary embodiments and figures, identical or identically acting components are in each case provided with the same reference numerals. The elements shown should not be considered as being to scale, but rather individual elements may be shown exaggeratedly large to assist in understanding.

DETAILED DESCRIPTION OF ILLUSTRATIVE EMBODIMENTS

Figure 1A:
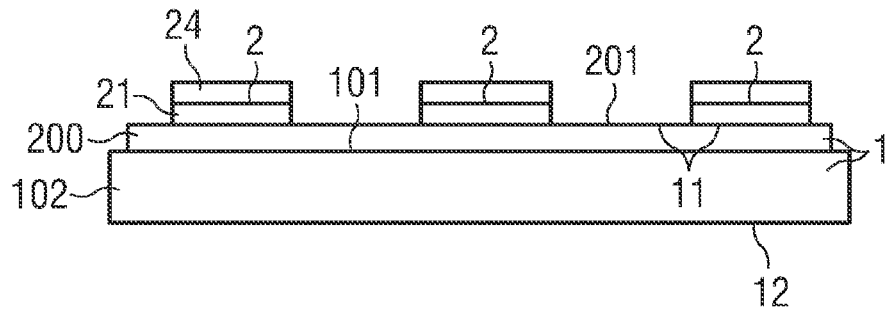
FIGS. 1A to 1G show individual manufacturing steps for producing an exemplary embodiment using a method described here.

FIG. 1A is a schematic side view of a first step, in which first of all a carrier 1 is provided, which comprises a first surface 11 and a second surface 12 opposite the first surface 11. The carrier 1 is formed with a base element 102 and an electrically insulating mounting element 200 arranged on an outer face 101 of the base element 102. In particular, the base element 102 may be formed with a metal, a semiconductor material and/or a glass. In the present case, the electrically insulating mounting element 200 is formed completely with a plastics material.

A plurality of radiation-emitting, optoelectronic semiconductor chips 2 is arranged on an outer face 201, remote from the base element 102, of the mounting element 200. In particular, the outer face 201, remote from the base element 102, of the mounting element 200 may at least in places form the first surface 11 of the carrier 1. The optoelectronic semiconductor chips 2 are each formed with at least one n-side region 21 and at least one p-side region 24, and in the present case are applied with the n-side region 21 to the first surface 11 of the carrier 1. Each of the optoelectronic semiconductor chips 2 comprises at least one active zone, which is suitable for emitting electromagnetic radiation. The optoelectronic semiconductor chips 2 may each emit light of a different color. For example, in each case at least one optoelectronic semiconductor chip 2 emits red light, green light or blue light.

Figure 1B:
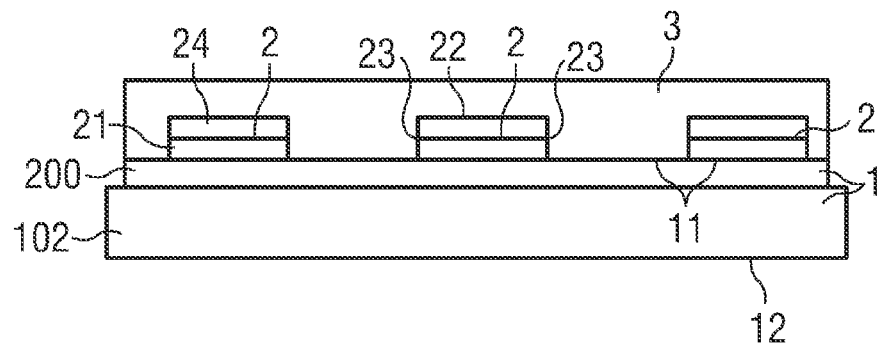

FIG. 1B shows, in a schematic side view, how in a next step an electrically insulating enclosure 3 is arranged on exposed points of the outer faces 23 of the semiconductor chips 2 and of the first surface 11 of the carrier 1. The electrically insulating enclosure 3 may in particular be of radiation-reflecting or radiation-absorbing construction. The electrically insulating enclosure 3 is, for example, formed with a matrix material, such as, for example, a silicone, an epoxide and/or a mixture of a silicone and an epoxide, into which are introduced radiation-reflecting or radiation-absorbing particles in a pre-determinable concentration. The radiation-reflecting particles are for example particles which may in particular be formed with $TiO_2$. To an external observer the electrically insulating enclosure 3 in this case appears white. To an external observer, for example, the optoelectronic semiconductor chips 2 are completely concealed by the electrically insulating enclosure 3 and thus not detectable by the external observer.

Figure 1C:
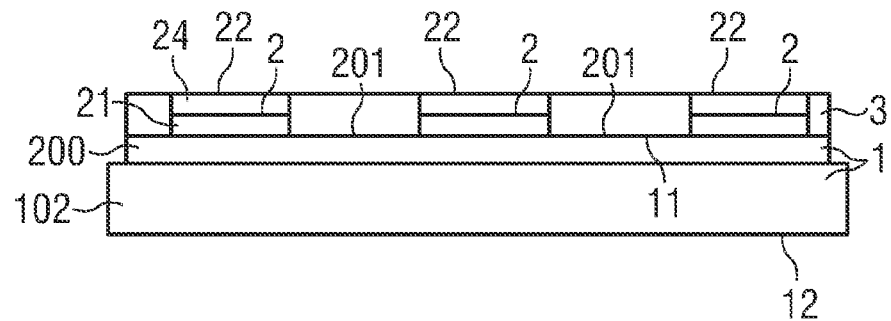

FIG. 1C is a schematic side view showing how in a next step the electrically insulating enclosure 3 is completely removed from a major face 22, remote from the carrier 1, of the p-side region 24 of the optoelectronic semiconductor chip 2 by means of uniform thinning. In this case, the major face 22 is part of the outer faces 23 of the semiconductor chip 2. In other words, after partial removal of the electrically insulating layer 3, the major face 22, remote from the carrier 1, of the p-side region 24 is completely free of the electrically insulating enclosure 3.

Figure 1D:
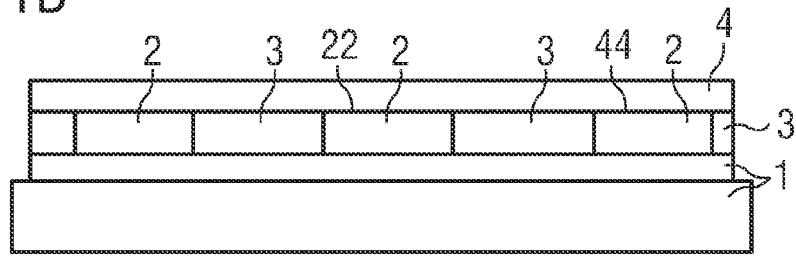

FIG. 1D shows, in a schematic side view, how in a next step a p-side conductive track structure 4 is applied onto the major face 22 and a surface, remote from the carrier 1, of the electrically insulating enclosure 3. The p-side conductive track structure 4 is formed with an electrically conductive material such as, for example, a metal and/or an electrically conductive adhesive. After application of the p-side conductive track structure 4, the latter extends with its outer face 44, for example, completely over the surface, remote from the carrier 1, of the electrically insulating enclosure 3 and the major face 22. By means of the p-side conductive track structure 4, the optoelectronic semiconductor chips 2 may be electrically driven and operated individually and separately from one another.

Figure 1E:
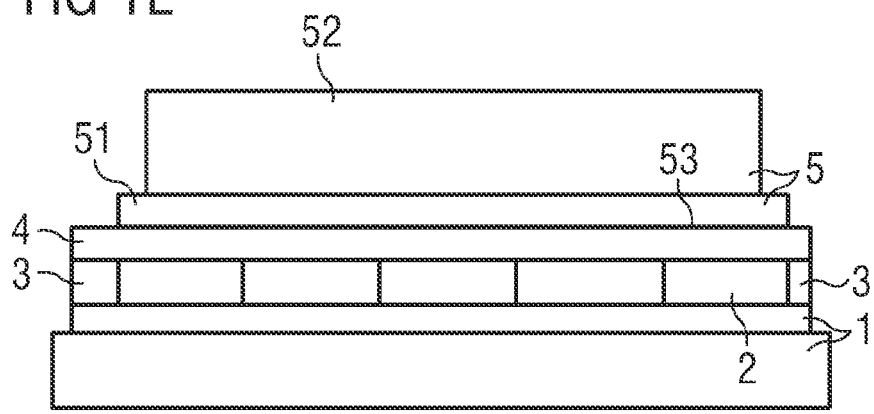

FIG. 1E shows, in a schematic side view, how in a next step a component carrier 5 is arranged on a side of the p-side conductive track structure 4 remote from the semiconductor chips 2. It is in particular clear from FIG. 1E that the component carrier 5 has been applied onto an outer face, remote from the carrier 1, of the p-side conductive track structure 4. The component carrier 5 may in particular be formed with an electrically insulating component layer 51 and a thermally conductive heat sink 52. To this end, in the present case the component carrier 5 is arranged with an outer face 53, remote from the thermally conductive heat sink 52, of the electrically insulating component layer 51 on the outer face of the p-side conductive track structure 4.

The thermally conductive heat sink 52 is, for example, formed with an electrically conductive material, for example, copper, since high thermal conductivity may be associated with high electrical conductivity. High thermal conductivity of the heat sink 52 may, in particular, be advantageous when, during operation of a subsequent semiconductor component 1,000 by the semiconductor chips 2, an elevated amount of heat develops, which, so that operation of the optoelectronic semiconductor component 1,000 proceeds in as trouble-free a manner as possible, may be dissipated from the semiconductor chips 2 as quickly and effectively as possible. The heat sink 52 is for example produced by means of an electrodeposition method.

If the heat sink 52 is not only thermally conductive but also electrically conductive, the electrically insulating component layer 51 insulates the heat sink 52 and the semiconductor chips 2 from one another electrically, such that, for example, electrical short circuits between the heat sink 52 and, for example, the p-side conductive track structure 4 are avoided during operation of the subsequent semiconductor component 1000. The electrically insulating component layer 51 is for example formed with an aluminum oxide and/or an aluminum nitride. The electrically insulating component layer 51 may, for example, be formed by means of atomic layer deposition (ALD), for example, onto the thermally conductive heat sink 52.

Figure 1F:
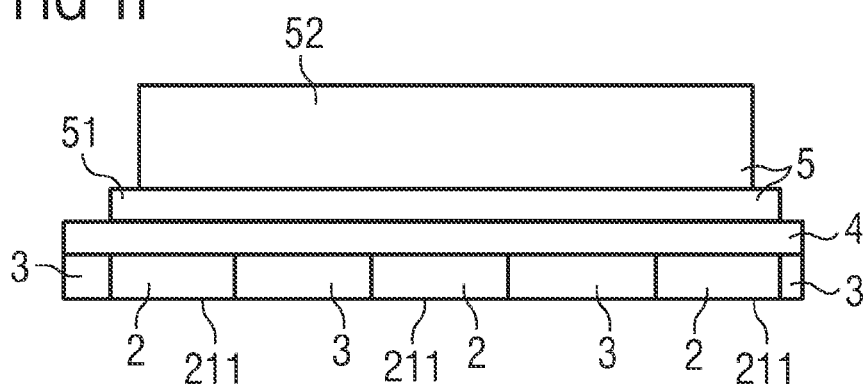

FIG. 1F shows, in a schematic side view, how in a next step the carrier 1 is removed, wherein, after removal of the carrier 1, the n-side region 21 is, for example, exposed in places. In the present case the n-side region 21 is formed in places by a radiation exit face 211 of the semiconductor chips 2. In other words, the radiation exit face 211 is exposed at least in places.

Figure 1G:
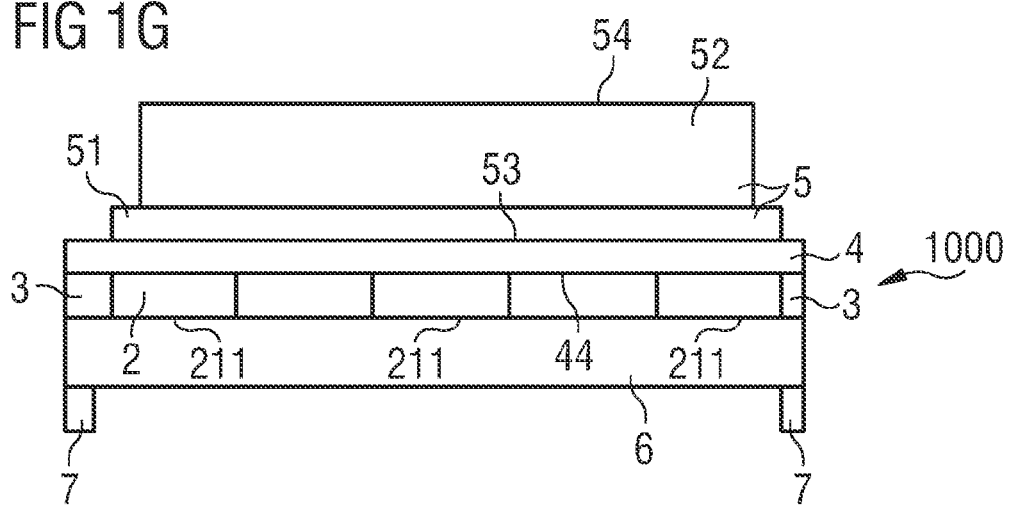

FIG. 1G shows, in a schematic side view, how in a next step at least one electrically conductive, transparent oxide layer 6 is applied onto the radiation exit faces 211 of the optoelectronic semiconductor chips 2 and onto a further surface, remote from the component carrier 5, of the electrically insulating enclosure 3. Electromagnetic radiation generated within the optoelectronic semiconductor chip 2 may therefore pass unimpeded via the radiation exit faces 211 of the optoelectronic semiconductor chips 2 through the electrically conductive, transparent oxide layer 6 and then exit the optoelectronic semiconductor component 1000. In this case, the electrically conductive, transparent oxide layer 6 contacts each of the semiconductor chips 2 electrically conductively on the n-side. To increase the radiation outcoupling efficiency of the optoelectronic semiconductor component 1000, an outer face, remote from the component carrier 5, of the electrically conductive, transparent oxide layer 6, may be patterned, for example, in a pre-determinable manner.

FIG. 1G further shows how contact pads 7 are arranged on the outer face, remote from the component carrier 5, of the electrically conductive, transparent oxide layer 6. The contact pads 7 serve in external n-side electrical contacting of the optoelectronic semiconductor chip 2. After arrangement of the contact pads 7, the optoelectronic semiconductor component 1,000 described here is produced. In this case, a mounting face 54, which is an outer face of the component carrier 5 remote from the electrically conductive, transparent oxide layer 6, serves in mounting of the optoelectronic semiconductor component 1,000, for example, on a contact carrier.

The invention is not restricted by the description given with reference to the exemplary embodiments. Rather, the invention covers any novel feature and any combination of features, including in particular any combination of features in the claims, even if this feature or this combination is not itself explicitly indicated in the claims or the exemplary embodiments.

The invention claimed is:

1. A method for making an optoelectronic semiconductor component, the method comprising:
    providing a carrier that comprises a first surface and a second surface opposite the first surface;
    arranging an optoelectronic semiconductor chip on the first surface of the carrier, the optoelectronic semiconductor chip being formed with an n-side region and a p-side region, the n-side region or the p-side region being applied to the first surface;
    arranging an electrically insulating enclosure on exposed points of outer faces of the semiconductor chip and of the first surface of the carrier, wherein the electrically insulating enclosure is radiation-reflecting or radiation absorbing;
    partially removing the electrically insulating enclosure so that a major face of the optoelectronic semiconductor chip is exposed at least in places;
    applying a conductive track structure at least on the exposed major face, wherein the conductive track structure is in direct contact with the semiconductor chip and electrically conductively conducted to the p-side or the n-side region;
    arranging a component carrier on a side of the conductive track structure remote from the semiconductor chip, wherein the component carrier comprises an electrically insulating component layer and a heat sink comprising a metal, wherein the electrically insulating component layer is formed between the conductive track structure and the heat sink, and wherein the heat sink is formed by an electrodeposition process; and
    after arranging the component carrier, exposing the n-side region or the p-side region at least in places by removing the carrier, wherein the component carrier mechanically stabilizes the optoelectronic semiconductor component.

2. The method according to claim 1, wherein, after removal of the electrically insulating enclosure, the major face, remote from the carrier, of the p-side region of the optoelectronic semiconductor chip is completely free of the electrically insulating enclosure, and wherein the electrically insulating enclosure is removed by uniform thinning of the electrically insulating enclosure.

3. The method according to claim 1, wherein, after removal of the electrically insulating enclosure, the major face, remote from the carrier, of the p-side region of the optoelectronic semiconductor chip is completely free of the electrically insulating enclosure.

4. The method according to claim 1, wherein the electrically insulating enclosure is removed by uniform thinning of the electrically insulating enclosure.

5. The method according to claim 1, further comprising, in a next step, arranging an electrically conductive, transparent oxide layer on a radiation exit face of the optoelectronic semiconductor chip, the electrically conductive, transparent oxide layer contacting the semiconductor chip electrically conductively on the n-side or the p-side.

6. The method according to claim 1, wherein the carrier is formed with a base element and an electrically insulating mounting element arranged on an outer face of the base element, the electrically insulating mounting element being formed at least in places with a plastics material and the optoelectronic semiconductor chip being arranged on an outer face of the electrically insulating mounting element remote from the base element.

7. The method according to claim 1, wherein a plurality of optoelectronic semiconductor chips are arranged on the first surface of the carrier, wherein at least two optoelectronic semiconductor chips emit light of different colors.

8. The method according to claim 1, wherein the optoelectronic semiconductor component takes a form of a light-emitting RGB module.

9. An optoelectronic semiconductor component which is produced according to the method of claim 1.

10. The method according to claim 1, wherein a plurality of optoelectronic semiconductor chips are arranged on the first surface of the carrier, wherein the optoelectronic semiconductor chips are electrically driven and operated individually and separately from one another via the conductive track structure.

11. A method for producing at least one optoelectronic semiconductor component, the method comprising:
    providing a carrier that comprises a first surface and a second surface opposite the first surface;
    arranging a plurality of optoelectronic semiconductor chips on the first surface of the carrier, each optoelectronic semiconductor chip being formed with an n-side region and a p-side region, the n-side region or the p-side region being applied to the first surface;
    arranging an electrically insulating enclosure on exposed points of outer faces of the semiconductor chips and of the first surface of the carrier, wherein the electrically insulating enclosure is radiation-reflecting or radiation absorbing;
    partially removing the electrically insulating enclosure such that a major face of each optoelectronic semiconductor chip is exposed at least in places;
    arranging a conductive track structure at least on the exposed major faces, wherein the conductive track structure is in direct contact with the semiconductor chips and electrically conductively contacted to the p-side or the n-side regions;
    arranging a component carrier on a side of a conductive track structure remote from the semiconductor chips, wherein the component carrier comprises an electrically insulating component layer and a thermally conductive heat sink comprising a metal, wherein the electrically insulating component layer is arranged between conductive track structure and the thermally conductive heat sink, wherein the thermally conductive heat sink is formed with an electrodeposition process; and
    after arranging the component carrier, exposing the n-side regions or the p-side regions at least in places by removing the carrier, wherein the component carrier mechanically stabilizes the optoelectronic semiconductor component,
    wherein, the optoelectronic semiconductor chips are electrically driven and operated individually and separately from one another via the conductive track structure,
    wherein the carrier comprises a base element and an electrically insulating mounting element, wherein the electrically insulating mounting element comprises a plastic material at least in places, and wherein the electrically insulating mounting element is arranged between the optoelectronic semiconductor chips and the base element, and
    wherein outermost optoelectronic semiconductor chips laterally exceed the thermally conductive heat sink.

* * * * *

UNITED STATES PATENT AND TRADEMARK OFFICE
CERTIFICATE OF CORRECTION

PATENT NO. : 9,112,127 B2
APPLICATION NO. : 14/003207
DATED : August 18, 2015
INVENTOR(S) : Berthold Hahn Page 1 of 1

It is certified that error appears in the above-identified patent and that said Letters Patent is hereby corrected as shown below:

On the Title Page, item (73) Assignee, delete "OSRAM Opto Semiconductor GmbH," and insert --OSRAM Opto Semiconductors GmbH,--.

Signed and Sealed this
Fifteenth Day of December, 2015

Michelle K. Lee
*Director of the United States Patent and Trademark Office*